United States Patent
Zhou et al.

(10) Patent No.: US 11,462,665 B2
(45) Date of Patent: Oct. 4, 2022

(54) APPARATUS FOR DETECTING ELECTROMAGNETIC TOUCH

(71) Applicants: Chengdu BOE Optoelectronics Technology Co., Ltd., Chengdu (CN); BOE Technology Group Co., Ltd., Beijing (CN)

(72) Inventors: Weilong Zhou, Beijing (CN); De Yuan, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/229,112

(22) Filed: Apr. 13, 2021

(65) Prior Publication Data
US 2021/0234078 A1    Jul. 29, 2021

Related U.S. Application Data

(62) Division of application No. 16/399,356, filed on Apr. 30, 2019, now Pat. No. 11,005,015.

(30) Foreign Application Priority Data

Jul. 2, 2018  (CN) .......................... 201810706930.7

(51) Int. Cl.
  *H01L 33/58*   (2010.01)
  *F21V 29/90*   (2015.01)
  (Continued)

(52) U.S. Cl.
CPC ............ *H01L 33/58* (2013.01); *F21V 23/002* (2013.01); *F21V 29/90* (2015.01); *G02B 7/028* (2013.01);
(Continued)

(58) Field of Classification Search
CPC ..... H01L 27/15; H01L 27/153; H01L 27/156; H01L 33/52; G02B 7/028; G06F 3/03545;
(Continued)

(56) References Cited

U.S. PATENT DOCUMENTS

| 2014/0062929 | A1* | 3/2014 | Lee .......................... G06F 3/041 345/173 |
|---|---|---|---|
| 2014/0146011 | A1 | 5/2014 | Huang et al. |

(Continued)

FOREIGN PATENT DOCUMENTS

| CN | 101615366 A | 12/2009 |
|---|---|---|
| CN | 1940843 A | 7/2011 |

(Continued)

OTHER PUBLICATIONS

Chinese Office Action for corresponding application 201810706930.7 dated Dec. 3, 2020.

*Primary Examiner* — Matthew E Warren
(74) *Attorney, Agent, or Firm* — ArentFox Schiff LLP; Michael Fainberg

(57) ABSTRACT

The disclosure discloses an apparatus for detecting an electromagnetic touch. The apparatus includes: a driving subcircuit configured to control organic light-emitting diodes arranged in an array in an organic light-emitting diode display panel to be lightened row by row; a detecting subcircuit configured to obtain detection current flowing through the lightened organic light-emitting diodes in real time, where the detection current of each of the lightened organic light-emitting diodes comprises inductive current of the organic light-emitting diode, and driving current of the organic light-emitting diode being lightened, and the inductive current is current, generated by the organic light-emitting diode, related to a magnetic induction intensity of a magnetic field emitted by a magnetic field emitting apparatus only when the organic light-emitting diode senses the (Continued)

magnetic field; and a first processing subcircuit configured to determine a position of an electromagnetic touch according to the driving current of each of the organic light-emitting diodes, and the obtained detection current thereof.

8 Claims, 4 Drawing Sheets

(51) Int. Cl.
*F21V 23/00* (2015.01)
*G02B 7/02* (2021.01)
*H01L 33/52* (2010.01)
*G06F 3/044* (2006.01)
*H01L 27/15* (2006.01)
*G06F 3/046* (2006.01)
*G06F 3/0354* (2013.01)
*G06F 3/041* (2006.01)

(52) U.S. Cl.
CPC .......... *G06F 3/03545* (2013.01); *G06F 3/046* (2013.01); *G06F 3/0414* (2013.01); *G06F 3/0447* (2019.05); *H01L 27/15* (2013.01); *H01L 27/153* (2013.01); *H01L 27/156* (2013.01); *H01L 33/52* (2013.01)

(58) Field of Classification Search
CPC ...... G06F 3/0414; G06F 3/046; G06F 3/0447; F21V 29/90; F21V 23/002
USPC ........................................ 257/40, 82, 88, 98
See application file for complete search history.

(56) References Cited

U.S. PATENT DOCUMENTS

| | | | |
|---|---|---|---|
| 2015/0091858 A1* | 4/2015 | Rosenberg | G06F 3/045 345/174 |
| 2016/0283010 A1 | 9/2016 | Zhang et al. | |
| 2016/0306489 A1 | 10/2016 | Mizuhashi et al. | |
| 2016/0349921 A1* | 12/2016 | Mizuhashi | G06F 3/0412 |
| 2018/0052548 A1* | 2/2018 | Katsuta | G06F 3/046 |
| 2018/0348917 A1 | 12/2018 | Wang et al. | |
| 2019/0012016 A1* | 1/2019 | Kurasawa | G06F 3/0412 |

FOREIGN PATENT DOCUMENTS

| | | |
|---|---|---|
| CN | 103855182 A | 6/2014 |
| CN | 103902132 A | 7/2014 |
| CN | 103927070 A | 7/2014 |
| CN | 106055139 A | 10/2016 |
| CN | 103941951 A | 7/2017 |
| CN | 107644611 A | 1/2018 |
| CN | 206945930 U | 1/2018 |

\* cited by examiner

S ⟶ ⟶ ⟶ T

S ⟶ ⟶ T₁ / T₀ / T₋₁

APPARATUS FOR DETECTING ELECTROMAGNETIC TOUCH

CROSS-REFERENCE TO RELATED APPLICATION

This application is a divisional application of U.S. patent application Ser. No. 16/399,356, filed on Apr. 30, 2019, which claims the benefit of Chinese Patent Application No. 201810706930.7, filed with the Chinese Patent Office on Jul. 2, 2018, the content of which is hereby incorporated by reference in its entirety.

FIELD

The present disclosure relates to the field of display technology, and particularly to an apparatus for detecting an electromagnetic touch, and a display device.

BACKGROUND

As the display technologies are advancing rapidly, a touch panel has pervaded our life gradually. As compared with a traditional display with only a display function, a display including the touch panel can enable a user to exchange information with the display, so the touch panel can completely or at least partially take the pace of a general input device so that the related display can display an image but also can be touched for control.

SUMMARY

Embodiments of the disclosure provide an apparatus for detecting an electromagnetic touch, and a display device.

In order to attain this object, the embodiments of the disclosure further provide an apparatus for detecting an electromagnetic touch, the apparatus including:

a driving subcircuit configured to control organic light-emitting diodes arranged in an array in an organic light-emitting diode display panel to be lightened row by row;

a detecting subcircuit configured to obtain detection current flowing through the lightened organic light-emitting diodes in real time, wherein the detection current of each of the lightened organic light-emitting diodes includes inductive current of the organic light-emitting diode of the organic light-emitting diode, and driving current of the organic light-emitting diode being lightened, and the inductive current is current, generated by the organic light-emitting diode, related to a magnetic induction intensity of a magnetic field emitted by a magnetic field emitting apparatus only when the organic light-emitting diode senses the magnetic field; and a first processing subcircuit configured to determine a position of an electromagnetic touch according to the driving current of each of the organic light-emitting diodes, and the obtained detection current thereof.

Optionally, in the embodiments of the disclosure, the first processing subcircuit is configured to determine change quantity of current between the driving current of each of the organic light-emitting diodes, and the obtained detection current thereof according to the driving current of each of the organic light-emitting diodes, and the obtained detection current thereof; and for each of the organic light-emitting diodes, determine the position of the organic light-emitting diode as the position of the electromagnetic touch when the change quantity of current corresponding to the organic light-emitting diode is above a preset threshold.

Optionally, in the embodiments of the disclosure, the apparatus for detecting an electromagnetic touch further includes a second processing subcircuit configured to determine a data signal of an image to be displayed, according to the determined position of the electromagnetic touch; and the driving subcircuit is further configured to control the organic light-emitting diode display panel to display the image according to the determined data signal.

Optionally, in the embodiments of the disclosure, the first processing subcircuit is further configured to determine a magnetic induction intensity of the magnetic field sensed by the organic light-emitting diode according to the change quantity of current, wherein the magnetic induction intensity is increasing as the change quantity of current is increasing; and the second processing subcircuit is further configured to determine the data signal of the image to be displayed, according to the determined position of the electromagnetic touch, and the determined magnetic induction intensity of the magnetic field.

Optionally, in the embodiments of the disclosure, the second processing subcircuit is configured to determine a locus of handwriting of an electromagnetic pen according to the determined position of the electromagnetic touch, and to determine a width of the handwriting of the electromagnetic pen according to the determined magnetic induction intensity of the magnetic field; and to determine the data signal of the image to be displayed, according to the determined locus and width the handwriting of the electromagnetic pen.

Optionally, in the embodiments of the disclosure, the first processing subcircuit is further configured to determine the change quantity of current between the driving current of each of the organic light-emitting diodes, and the obtained detection current thereof according to an absolute value of a difference between the driving current of each of the organic light-emitting diodes, and the obtained detection current thereof.

Correspondingly the embodiments of the disclosure further provide a display device including: an apparatus for emitting a magnetic field, an organic light-emitting diode display panel, and the apparatus for detecting an electromagnetic touch according to the embodiments above of the disclosure.

Optionally, in the embodiments of the disclosure, the apparatus for emitting a magnetic field includes an electromagnetic pen.

DETAILED DESCRIPTION OF THE EMBODIMENTS

Figure 1:
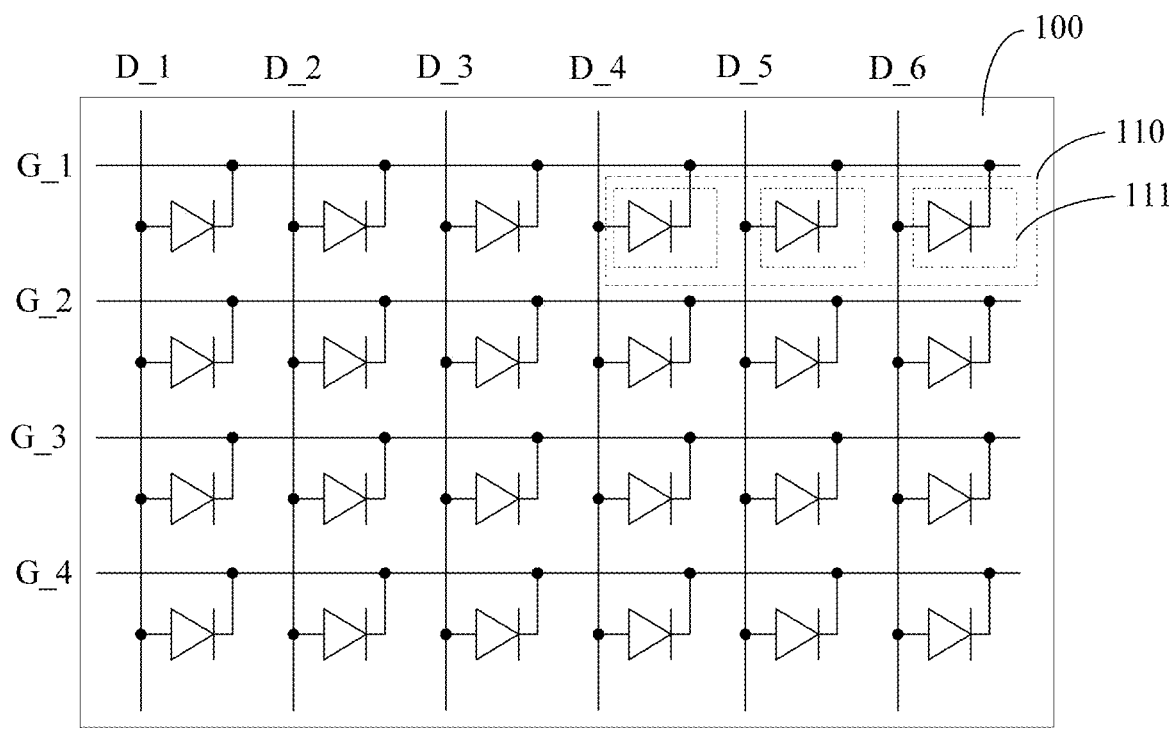
FIG. 1 is a schematic structural diagram of an organic light-emitting diode display panel according to the embodiments of the disclosure in a top view.

Common touch panels include a resistive touch panel, a capacitive touch panel, an electromagnetic touch panel, etc. Particularly generally a magnetic field is emitted from a specific electromagnetic pen to the related electromagnetic touch panel to induce a magnetic field change in an electromagnetically induced coil on the electromagnetic touch panel to generate weak current, so that a touch position is calculated according to the generated weak current. However the electromagnetic touch panel is typically attached on a display panel in the display including the electromagnetic touch panel, thus necessitating an additional fabrication process, and increasing a cost.

In order to make the objects, technical solutions, and advantages of the disclosure more apparent, particular implementations of the method and apparatus for detecting an electromagnetic touch, the display device, the computer readable storage medium, and the computer device according to the embodiments of the disclosure will be described below with reference to the drawings. It shall be appreciated the preferable embodiments to be described below are only intended to illustrate and explain the disclosure, but not to limit the disclosure thereto. Furthermore the embodiments of the disclosure, and the features in the embodiments can be combined with each other unless they conflict with each other. Moreover the thicknesses, sizes, and shapes of respective layers in the drawings will not reflect any real proportion of a display panel, but are only intended to illustrate the disclosure of the disclosure.

Figure 2:
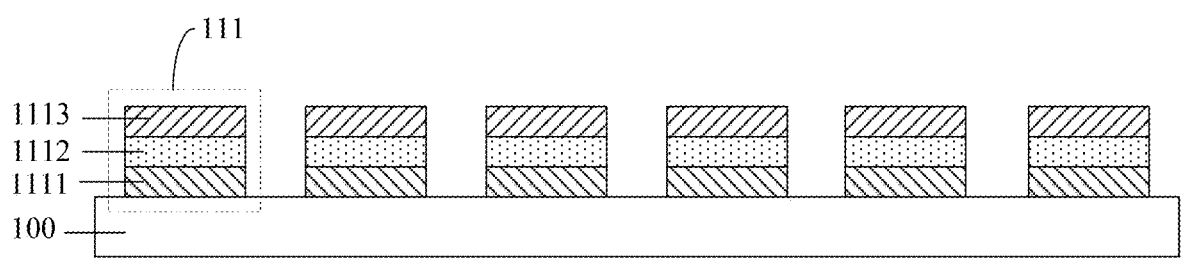
FIG. 2 is a schematic structural diagram of the organic light-emitting diode display panel according to the embodiments of the disclosure in a sectional view.

As illustrated in FIG. 1 and/or FIG. 2, an organic light-emitting diode display panel can include: an underlying substrate 100, a plurality of pixel elements 110 arranged in an array on the underlying substrate 100, gate lines G_m (m is an integer greater than or equal to 1, and less than or equal to M, and M is the total number of gate lines in the organic light-emitting diode display panel, e.g., M=4 in FIG. 1) extending in the row direction of the pixel elements 110, and data lines D_n (n is an integer greater than or equal to 1, and less than or equal to N, and N is the total number of data lines in the organic light-emitting diode display panel, e.g., N=6 in FIG. 1) extending in the column direction of the pixel elements 110. Each pixel element 110 can include a plurality of sub-pixels 111. Each sub-pixel 111 can include an Organic Light-Emitting Diode (OLED). Cathodes of a row of OLEDs are connected with a gate line G_m, anodes of a column of OLEDs are connected with a data line D_n, and different columns of OLEDs are connected with different data lines. Preferably the organic light-emitting diode display panel according to this embodiment is a passive organic light-emitting diode display panel. Of course, optionally, the organic light-emitting diode display panel can be an active organic light-emitting diode display panel, although the embodiments of the disclosure will not be limited thereto.

Optionally, as illustrated in FIG. 2, each OLED can include an anode 1111, a light-emitting layer 1112, and a cathode 1113 arranged on the underlying substrate 100 sequentially. Furthermore the OLED can further include: a hole injection layer located on the side of the anode away from the underlying substrate, a hole transmission layer located between the hole injection layer and the light-emitting layer, and an electronic injection layer located between the light-emitting layer and the cathode. Particularly the material of the anode can include IndiumTinOxide (ITO). The material of the hole injection layer can include Copper Phthalocyanine (CuPc), and the thickness of the layer thereof can be 15 nm. The material of the hole transmission layer can include N, N'-bis (1-naphthyl)-N, N'-diphenyl-1, 1'-biphenyl-4-4'-diamine (NPB), and the thickness of the layer thereof can be 60 nm. The material of the light-emitting layer can include an organic electroluminescent material, e.g., tri (8-hydroxyquinoline) aluminium ($Alq_3$), and the thickness of the layer thereof can be 80 nm. The material of the electron injection layer can include Lithium Fluoride (LiF), and the thickness of the layer thereof can be 1 nm. The material of the cathode can include aluminium (Al), and the thickness of the layer thereof can be 120 nm.

Figures 3A, 3B, 4:
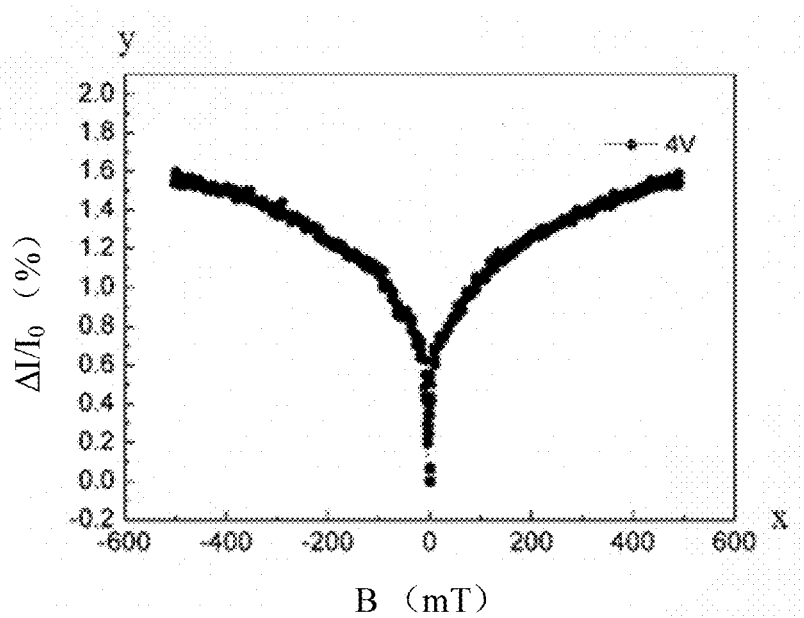
FIG. 3A is a first schematic diagram of energy levels of a polarized polaron pair.
FIG. 3B is a second schematic diagram of energy levels of a polarized polaron pair.
FIG. 4 is a curve graph of the relationship between a relative change quantity of current and a varying magnetic induction intensity.

Optionally, when voltage is applied across the anode and the cathode of the OLED, there is a difference in voltage between the anode and the cathode, so holes and electrons enter the organic electroluminescent material, and are recombined into polaron pairs including a uniplet polaron pair S and a triplet polaron pair T. The triplet polaron pair T further includes three states $T_1$, $T_0$, and $T_{-1}$. Here the uniplet polaron pair S has higher ionicity than the triplet polaron pair T, so it is easier to disassociate the uniplet polaron pair S into free charges to contribute driving current for driving the OLED to emit light. When there is no magnetic field (i.e., a magnetic induction intensity B=0) in an environment including the OLED, there is the same energy level of the uniplet polaron pair S and the triplet polaron pair T (i.e., the same energy level at $T_1$, $T_0$, and $T_{-1}$) as illustrated in FIG. 3A, so that the uniplet polaron pair S is transformed into the triplet polaron pair T through inter-band traversal. When there is a magnetic field (i.e., a magnetic induction intensity B≠0) in the environment including the OLED, the triplet polaron pair T is Zeeman-disrupted into the three sub-states $T_1$, $T_0$, and $T_{-1}$ as illustrated in FIG. 3B. Of the three sub-states $T_1$, $T_0$, and $T_{-1}$, only the energy at $T_0$ is approximate to the energy of the uniplet polaron pair S, and Zeeman energy is introduced to the states $T_1$ and $T_{-1}$ relative to the state $T_0$, that is, an energy level barrier is introduced among the three sub-states of the triplet polaron pair $T_0$, so that the polaron pair is suppressed from being transformed from the state S to the two sub-states $T_1$ and $T_{-1}$. Furthermore the energy level barrier is increasing as the magnetic induction intensity is increasing, so inter-band traversal of the uniplet polaron pair S to the triplet polaron pair T is weaken in a magnetic field with B≠0 as compared with B=0, so that the uniplet polaron pair S is suppressed from being transformed into the triplet polaron pair T, and thus the dosage of the uniplet polaron pair S is increasing so that there are a larger number of electrons and holes into uniplet polaron pairs S are disassociated, thus resulting in larger current flowing through the OLED. Accordingly, when a given structure of the OLED is applied and the voltage applied across the anode and the cathode of the OLED is constant, the magnetic induction intensity is increasing as a change quantity of current is increasing. Optionally, the correspondence relationship between a magnetic induction intensity B and a change quantity of current $\Delta I$ can be detected by a detecting device, and a detection result can be as illustrated in FIG. 4, where FIG. 4 illustrates a curve graph of the relationship between a relative change quantity of current and a varying magnetic induction intensity when the voltage difference between the anode and the cathode of the OLED is 4V. In FIG. 4, the abscissa x represents the magnetic induction intensity B of the magnetic field, where the positive or negative sign of B represents the direction of the magnetic field; and the ordinate y represents the relative change quantity of current $$\frac{\Delta I}{I_0},$$

where $I_0$ represents driving current of the OLED being lightened. As can be apparent from FIG. 4, corresponding B is increasing as $$\frac{\Delta I}{I_0}$$

is larger, that is, corresponding B is increasing as Al is increasing.

Figure 5:
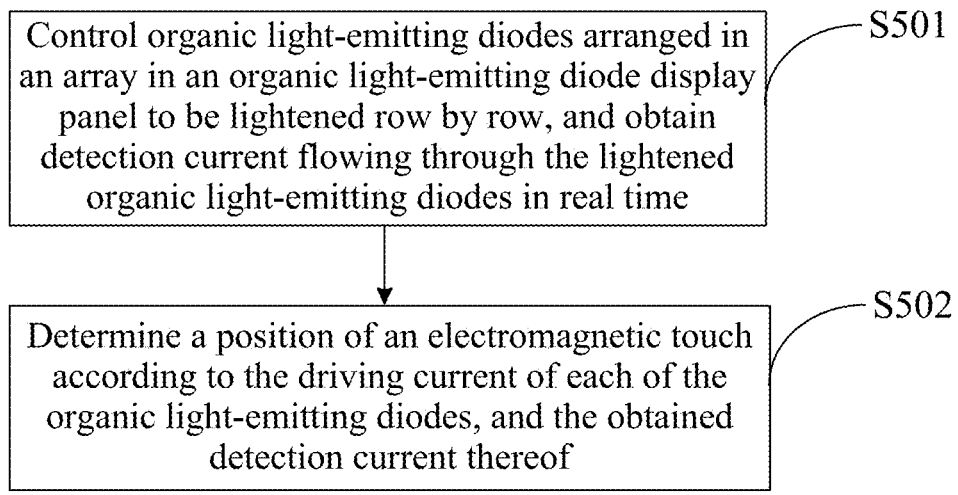
FIG. 5 is a flow chart of a method for detecting an electromagnetic touch according to the embodiments of the disclosure.

Hereupon the embodiments of the disclosure provide a method for detecting an electromagnetic touch, and as illustrated in FIG. 5, the method can include the following steps.

Step S501, control organic light-emitting diodes arranged in an array in an organic light-emitting diode display panel to be lightened row by row, and obtain detection current flowing through the lightened organic light-emitting diodes in real time, where the detection current of each of the lightened organic light-emitting diodes includes inductive current of the organic light-emitting diode, and driving current of the organic light-emitting diode being lightened, and the inductive current is current, generated by the organic light-emitting diode, related to a magnetic induction intensity of a magnetic field emitted by a magnetic field emitting apparatus only when the organic light-emitting diode senses the magnetic field.

Step S502, determine a position of an electromagnetic touch according to the driving current of each of the organic light-emitting diodes, and the obtained detection current thereof.

In the method for detecting an electromagnetic touch according to the embodiments of the disclosure, the organic light-emitting diodes arranged in an array in the organic light-emitting diode display panel are controlled to be lightened row by row, and the detection current flowing through each of the lightened organic light-emitting diodes is obtained in real time. Since the detection current includes the inductive current of each of the organic light-emitting diodes, and the driving current of the organic light-emitting diode being lightened, and the inductive current is the current, generated by the organic light-emitting diode, related to the magnetic induction intensity of the magnetic field emitted by the magnetic field emitting apparatus only when the organic light-emitting diode senses the magnetic field, the position of the electromagnetic touch can be determined according to the driving current of each of the organic light-emitting diodes, and the obtained detection current thereof, so that the organic light-emitting diode display panel can enable both an electromagnetic touch function and a display function, thus simplifying the structure and the fabrication process thereof, and lowering the cost thereof.

Optionally, in the embodiments of the disclosure, in order to control one row of organic light-emitting diodes to be lightened, forward ON voltage is applied to cathodes of the row of organic light-emitting diodes, voltage of respective data signals is applied respectively to anodes of the respective organic light-emitting diodes in the row, and inverse OFF voltage is applied to cathodes of another rows of organic light-emitting diodes. Particularly as illustrated in FIG. 1, in order to control a first row of organic light-emitting diodes to be lightened, forward ON voltage is applied to a gate line G_1, and inverse OFF voltage is applied to gate lines G_2 to G_4 so that the forward ON voltage is applied to the cathodes of the first row of organic light-emitting diodes, and the inverse OFF voltage is applied to the cathodes of the second to fourth rows of organic light-emitting diodes; and voltage of respective data signals is applied respectively to data lines D_1 to D_6, so that the voltage of the respective data signals is applied respectively to the anodes of the respective organic light-emitting diodes in the first row to thereby lighten the respective organic light-emitting diodes in the first row. Alike in order to control a second row of organic light-emitting diodes to be lightened, forward ON voltage is applied to the gate line G_2, and inverse OFF voltage is applied to the gate lines G_1, G_3, and G_4 so that the forward ON voltage is applied to the cathodes of the second row of organic light-emitting diodes, and the inverse OFF voltage is applied to the cathodes of the first, third, and fourth rows of organic light-emitting diodes; and voltage of respective data signals is applied respectively to data lines D_1 to D_6, so that the voltage of the respective data signals is applied respectively to the anodes of the respective organic light-emitting diodes in the second row to thereby lighten the respective organic light-emitting diodes in the second row. Alike the respective organic light-emitting diodes in the third and fourth rows can be lightened, so a repeated description thereof will be omitted here.

Optionally, in the embodiments of the disclosure, the driving current of the respective organic light-emitting diodes can be pre-stored, or the driving current of the respective organic light-emitting diodes can be obtained according to voltage applied respectively across the anode and the cathode of the respective lightened organic light-emitting diodes; and since voltage applied across the anode and the cathode of an OLED can be determined, driving current of the OLED being lightened can be determined according to the determined voltage applied across the anode and the cathode of the OLED, so that the determined driving current is stored for comparison with obtained detection current to determine the position of an electromagnetic touch.

Since current flowing through an OLED is increasing in a magnetic field, Optionally, in the embodiments of the disclosure, the method can particularly include: change quantity of current between the driving current of each of the organic light-emitting diodes, and the obtained detection current thereof are determined according to the driving current of each of the organic light-emitting diodes, and the obtained detection current thereof; for each organic light-emitting diode, when the change quantity of current corresponding to the organic light-emitting diode is above a preset threshold, the position of the organic light-emitting diode is determined as the position of the electromagnetic touch. Since the driving current of the organic light-emitting diode being lightened varies due to a fabrication process factor and wearing, etc., when the change quantity of driving current of the organic light-emitting diode being lightened lies in an allowable error range, it can be determined that the driving current thereof is constant. Accordingly the preset threshold can range from 0 to $\Delta I_0$, where $\Delta I_0$ is the preset threshold, i.e., the maximum of an error of the driving current of the organic light-emitting diode within the allowable error range. In this way, when the change quantity of current corresponding to the organic light-emitting diode is above the preset threshold, it can be determined that the organic light-emitting diode generates inductive current in a magnetic field, so the position of the organic light-emitting diode in the organic light-emitting diode display panel can be determined as the position of the electromagnetic touch.

Optionally, in the embodiments of the disclosure, after the position of the electromagnetic touch is determined, the method can further include: a data signal of an image to be displayed is determined according to the determined position of the electromagnetic touch; and the organic light-emitting diode display panel is controlled to display the image according to the determined data signal. In this way, the organic light-emitting diode display panel can be controlled to display the image according to the position of the electromagnetic touch, so that the electromagnetic touch function and the display function can be integrated the organic light-emitting diode display panel.

Furthermore, optionally, in the embodiments of the disclosure, the method can further include the following operations: a magnetic induction intensity of the magnetic field sensed by the organic light-emitting diode is determined according to the change quantity of current, where the magnetic induction intensity is increasing as the change quantity of current is increasing; and the data signal of the image to be displayed can be determined particularly as follows: the data signal of the image to be displayed is determined according to the determined position of the electromagnetic touch, and the determined magnetic induction intensity of the magnetic field. In this way, the magnetic induction intensity is determined according to the change quantity of current, and further the data signal of the image to be displayed is determined according to the position of the electromagnetic touch, and the magnetic induction intensity, thus improving the effect of the displayed image. These operations can be performed when the change quantity of current corresponding to the organic light-emitting diode is above the preset threshold, the position of the organic light-emitting diode is determined as the position of the electromagnetic touch.

Optionally, in the embodiments of the disclosure, the magnetic field emitting apparatus can include an electromagnetic pen. In the embodiments of the disclosure, the data signal of the image to be displayed can be determined according to the determined position of the electromagnetic touch, and the determined magnetic induction intensity of the magnetic field particularly as follows.

A locus of handwriting of the electromagnetic pen is determined according to the determined position of the electromagnetic touch, and a width of the handwriting of the electromagnetic pen is determined according to the determined magnetic induction intensity of the magnetic field; and the data signal of the image to be displayed is determined according to the determined locus and width of the handwriting of the electromagnetic pen. Generally the electromagnetic pen can be used to input a font or a plot, the locus and the width of a line plotted using the electromagnetic pen can be determined according to the locus and the width of the handwriting of the electromagnetic pen, and further the image can be displayed according to the locus and the width of the line, thus improving the effect of the image displayed on the organic light-emitting diode display panel.

The method for detecting an electromagnetic touch according to the embodiments of the disclosure will be described below in some embodiments. However the readers shall appreciate that a particular implementation thereof will not be limited thereto. The method for detecting an electromagnetic touch according to the embodiments of the disclosure can include the following steps.

The first step, control the OLEDs to be lightened row by row, and to obtain detection current $I_1$ flowing through the lightened OLED in real time, where $I_1 = I_2 + I_3$, $I_2$ represents driving current of each of the OLEDs being lightened, and $I_3$ represents inductive current of the OLED.

In some embodiments, $I_3$ is related to a magnetic field, emitted by an electromagnetic pen, sensed by the OLED, that is, the OLED generates $I_3$ only when it senses the magnetic field emitted by the electromagnetic pen, but will not generate $I_3$ if it do not sense the magnetic field emitted by the electromagnetic pen.

The second step, determine change quantity of current $\Delta I$ between the driving current $I_2$ of each of the OLEDs, and the obtained detection current $I_1$ thereof according to the driving current of each of the OLEDs, and the obtained detection current thereof.

In some embodiments, when an OLED senses the magnetic field emitted by the electromagnetic pen, $\Delta I$ may be $I_3$ in the allowable error range. When the OLED does not sense the magnetic field emitted by the electromagnetic pen, $\Delta I$ may be 0 in the allowable error range.

The third step, for each of the OLEDs, when the change quantity of current $\Delta I$ corresponding to the OLED is above the preset threshold $\Delta I_0$, determine that the OLED senses the magnetic field emitted by the electromagnetic pen, that is, determine the position of the OLED as the position of the electromagnetic touch, and determine the magnetic induction intensity of the magnetic field sensed by the OLED according to the change quantity of current $\Delta I$ corresponding to the OLED, where the magnetic induction intensity is increasing as the change quantity of current $\Delta I$ is increasing; and when the change quantity of current $\Delta I$ corresponding to the OLED is below the preset threshold $\Delta I_0$, determine that the OLED does not sense the magnetic field emitted by the electromagnetic pen, that is, determine the position of the OLED not as the position of the electromagnetic touch.

The fourth step, determine the locus of the handwriting of the electromagnetic pen according to the determined position of the electromagnetic touch, and determine the width of the handwriting of the electromagnetic pen according to the determined magnetic induction intensity of the magnetic field, where the corresponding width of the handwriting of the electromagnetic pen may be increasing as the magnetic induction intensity is increasing, and the corresponding width of the handwriting of the electromagnetic pen may be decreasing as the magnetic induction intensity is decreasing. In this way, while a user is writing using the electromagnetic pen, the width of the handwriting can become wider or narrower to thereby become more indicative, or while the user is plotting using the electromagnetic pen, the line width of the graph plotted using the electromagnetic pen can become wider or smaller narrower, or the color of the plotted graph can become darker or lighter.

The fifth step, determine a data signal of an image to be displayed, according to the determined locus and width of the handwriting of the electromagnetic pen. For example, if word written using the electromagnetic pen is "hello", then the data signal that will display an image "hello" is formed according to the word "hello" written using the electromagnetic pen, or while the user is plotting using the electromagnetic pen, the data signal that will display an graph is formed according to the graph plotted using the electromagnetic pen.

The sixth step, control the organic light-emitting diode display panel to display the image according to the determined data signal. In this way, the word "hello", or the graph plotting using the electromagnetic pen can be displayed on the organic light-emitting diode display panel, so that the organic light-emitting diode display panel can enable both the electromagnetic touch function and the display function.

Figure 6:
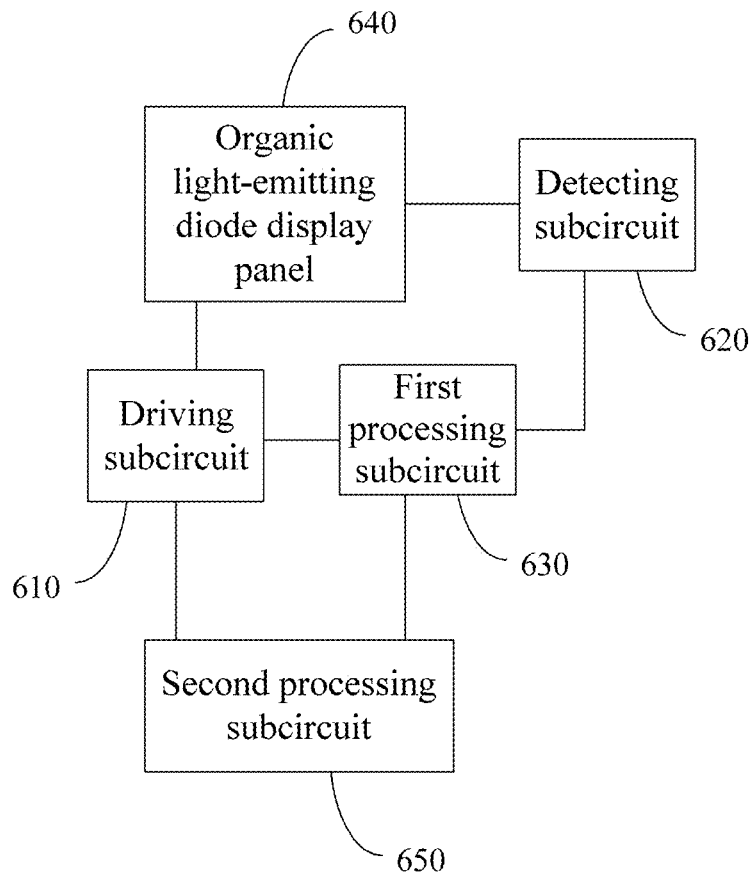
FIG. 6 is a schematic structural diagram of an apparatus for detecting an electromagnetic touch according to the embodiments of the disclosure.

Based upon the same inventive idea, the embodiments of the disclosure provide an apparatus for detecting an electromagnetic touch, and as illustrated in FIG. 6, the apparatus can include:

a driving subcircuit 610 is configured to control organic light-emitting diodes arranged in an array in an organic light-emitting diode display panel 640 to be lightened row by row;

a detecting subcircuit 620 is configured to obtain detection current flowing through the lightened organic light-emitting diodes in real time, where the detection current of each of the lightened organic light-emitting diodes includes inductive current of the organic light-emitting diode, and driving current of the organic light-emitting diode being lightened, and the inductive current is current, generated by the organic light-emitting diode, related to a magnetic induction intensity of a magnetic field emitted by a magnetic field emitting apparatus only when the organic light-emitting diode senses the magnetic field; and a first processing subcircuit 630 is configured to determine a position of an electromagnetic touch according to the driving current of each of the organic light-emitting diodes, and the obtained detection current thereof.

Optionally, in the embodiments of the disclosure, the first processing subcircuit is configured to determine change quantity of current between the driving current of each of the organic light-emitting diodes, and the obtained detection current thereof according to the driving current of each of the organic light-emitting diodes, and the obtained detection current thereof; and for each of the organic light-emitting diodes, determine the position of the organic light-emitting diode as the position of the electromagnetic touch when the change quantity of current corresponding to the organic light-emitting diode is above a preset threshold.

Optionally, in the embodiments of the disclosure, as illustrated in FIG. 6, the apparatus for detecting an electromagnetic touch further includes a second processing subcircuit 650 configured to determine a data signal of an image to be displayed, according to the determined position of the electromagnetic touch; and the driving subcircuit 610 is further configured to control the organic light-emitting diode display panel to display the image according to the determined data signal.

Optionally, in the embodiments of the disclosure, the first processing subcircuit is configured, to determine a magnetic induction intensity of the magnetic field sensed by the organic light-emitting diode according to the change quantity of current, where the magnetic induction intensity is increasing as the change quantity of current is increasing; and the second processing subcircuit is further configured to determine the data signal of the image to be displayed, according to the determined position of the electromagnetic touch, and magnetic induction intensity of the magnetic field. These operations that performed by the first processing unit subcircuit and the second processing subcircuit can be performed when the change quantity of current corresponding to the organic light-emitting diode is above the preset threshold, the position of the organic light-emitting diode is determined as the position of the electromagnetic touch.

Optionally, in the embodiments of the disclosure, the second processing subcircuit is configured to determine a locus of handwriting of an electromagnetic pen according to the determined position of the electromagnetic touch, and determine a width of the handwriting of the electromagnetic pen according to the determined magnetic induction intensity of the magnetic field; and to determine the data signal of the image to be displayed, according to the determined locus and width the handwriting of the electromagnetic pen.

Optionally, in the embodiments of the disclosure, the driving subcircuit is configured to control a row of organic light-emitting diodes to be lightened, by applying forward ON voltage to cathodes of the row of organic light-emitting diodes, applying voltage of respective data signals respectively to anodes of the respective organic light-emitting diodes in the row, and applying inverse OFF voltage to cathodes of the other rows of organic light-emitting diodes.

Optionally, the apparatus organic light-emitting diode display panel according to the embodiments of the disclosure can be embodied in the form of an all-hardware embodiment, an all-software embodiment, or an embodiment of a combination of software and hardware, although the embodiments of the disclosure will not be limited thereto.

Furthermore, optionally, in the embodiments of the disclosure, the driving subcircuit can include a display driving Integrated Circuit (IC) configured to control the organic light-emitting diodes arranged in an array in the organic light-emitting diode display panel to be lightened row by row.

Furthermore, optionally, in the embodiments of the disclosure, the first processing subcircuit can include a first touch driving IC. The second processing subcircuit can include a second touch driving IC. Of course, the first touch driving IC and the second touch driving IC can alternatively be arranged as one touch driving IC to thereby improve the integrity of the IC so as to further reduce a space occupied.

Furthermore, optionally, in the embodiments of the disclosure, the detecting subcircuit can include a current detecting circuit.

Figure 7:
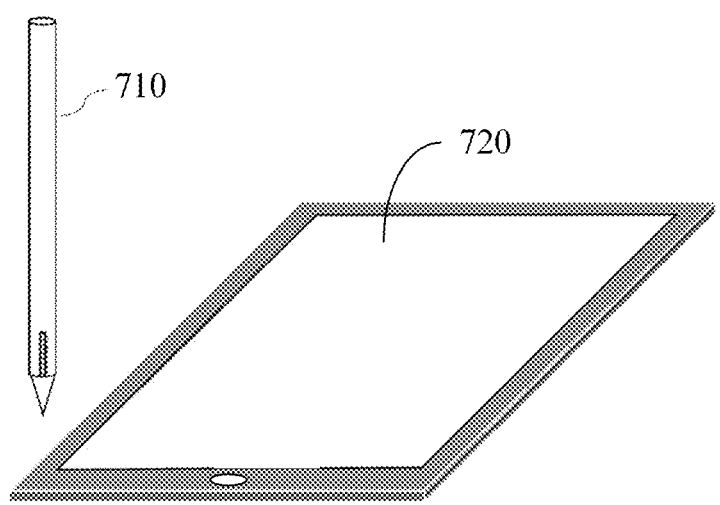
FIG. 7 is a schematic structural diagram of a display device according to the embodiments of the disclosure.

Based upon the same inventive idea, the embodiments of the disclosure further provide a display device as illustrated in FIG. 7, which can include an apparatus 710 for emitting a magnetic field, an organic light-emitting diode display panel 720, and the apparatus for detecting an electromagnetic touch. The display device can address the problem under a similar principle to the apparatus above for detecting an electromagnetic touch, so a reference can be made to the implementation of the apparatus above for detecting an electromagnetic touch for an implementation of the display device, and a repeated description thereof will be omitted here.

Optionally, as illustrated in FIG. 7, the apparatus 710 for emitting a magnetic field can include an electromagnetic pen which can include a pressure-sensitive apparatus and an electromagnet, where the pressure-sensitive apparatus senses a pressure, and passes a corresponding intensity signal to the electromagnet, and the electromagnet generates a magnetic force with a corresponding intensity according to the intensity signal. In a real application, the electromagnetic pen can be substantially structured as in the related art, so a repeated description thereof will be omitted here.

Optionally, the display device according to the embodiments of the disclosure can be a mobile phone, a tablet computer, a notebook computer, a digital photo frame, a navigator, or any other product or component with a display function. All the other components indispensable to the display device shall readily occur to those ordinarily skilled in the art, so a repeated description thereof will be omitted here, and the embodiments of the disclosure will not be limited thereto.

Based upon the same inventive idea, the embodiments of the disclosure further provide a computer readable storage medium storing computer program configured, upon being executed by a computer, to perform the steps in the method for detecting an electromagnetic touch according to any one of the embodiments above of the disclosure. Particularly the disclosure can be embodied in the form of a computer program product embodied on one or more computer readable storage mediums (including but not limited to a magnetic disk memory, an optical memory, etc.) including computer useable program codes.

Optionally, the computer readable storage medium can be any computer accessible available medium or data storage device including but not limited to a magnetic memory (e.g., a floppy disk, a hard disk, a magnetic tape, a Magnetic-Optical (MO) disk, etc.), an optical memory (e.g., a CD, a DVD, a BD, an HVD, etc.), a semiconductor memory (e.g., an ROM, an EPROM, an EEPROM, a nonvolatile memory (NAND FLASH), a Solid-State hard Disk (SSD), etc.), etc.

Based upon the same inventive idea, the embodiments of the disclosure further provide a computer device including a memory, a processor, and computer program storage on the memory, and executable on the processor, where the processor is configured to execute the computer program to perform the steps in the method for detecting an electromagnetic touch according to any one of the embodiments above of the disclosure.

Optionally, the computer device according to the embodiments of the disclosure can further include an input device, an output device, etc., where the input device can include a keyboard, a mouse, a touch panel, etc., and the output device can include a display device, e.g., a Liquid Crystal Display (LCD), etc. For example, the computer device can be configured to set lightening detection on the organic light-emitting diode display panel according to the embodiments of the disclosure.

In the method and apparatus for detecting an electromagnetic touch, the display device, the computer readable storage medium, and the computer device according to the embodiments of the disclosure, the organic light-emitting diodes arranged in an array in the organic light-emitting diode display panel are controlled to be lightened row by row, and the detection current flowing through each of the lightened organic light-emitting diodes is obtained in real time. Since the detection current includes the inductive current of each of the organic light-emitting diodes, and the driving current of the organic light-emitting diode being lightened, and the inductive current is the current, generated by the organic light-emitting diode, related to the magnetic induction intensity of the magnetic field emitted by the magnetic field emitting apparatus only when it senses the magnetic field, the position of the electromagnetic touch can be determined according to the driving current of each of the organic light-emitting diodes, and the obtained detection current thereof, so that the organic light-emitting diode display panel can enable both an electromagnetic touch function and a display function, thus simplifying the structure and the fabrication process thereof, and lowering the cost thereof.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An apparatus for detecting an electromagnetic touch, the apparatus comprising:
    a driving subcircuit configured to control organic light-emitting diodes arranged in an array in an organic light-emitting diode display panel to be lightened row by row;
    a detecting subcircuit configured to obtain detection current flowing through the lightened organic light-emitting diodes in real time, wherein the detection current of each of the lightened organic light-emitting diodes comprises inductive current of the organic light-emitting diode, and driving current of the organic light-emitting diode being lightened, and the inductive current is current, generated by the organic light-emitting diode, related to a magnetic induction intensity of a magnetic field emitted by a magnetic field emitting apparatus only when the organic light-emitting diode senses the magnetic field; and
    a first processing subcircuit configured to determine a position of an electromagnetic touch according to the driving current of each of the organic light-emitting diodes, and the obtained detection current thereof.

2. The apparatus according to claim 1, wherein the first processing subcircuit is configured to determine change quantity of current between the driving current of each of the organic light-emitting diodes, and the obtained detection current thereof according to the driving current of each of the organic light-emitting diodes, and the obtained detection current thereof; and for each of the organic light-emitting diodes, determine the position of the organic light-emitting diode as the position of the electromagnetic touch when the change quantity of current corresponding to the organic light-emitting diode is above a preset threshold.

3. The apparatus according to claim 2, wherein the apparatus for detecting an electromagnetic touch further comprises a second processing subcircuit configured to determine a data signal of an image to be displayed, according to the determined position of the electromagnetic touch; and
    the driving subcircuit is further configured to control the organic light-emitting diode display panel to display the image according to the determined data signal.

4. The apparatus according to claim 3, wherein the first processing subcircuit is further configured to determine a magnetic induction intensity of the magnetic field sensed by the organic light-emitting diode according to the change quantity of current, wherein the magnetic induction intensity is increasing as the change quantity of current is increasing; and
    the second processing subcircuit is further configured to determine the data signal of the image to be displayed, according to the determined position of the electromagnetic touch, and the determined magnetic induction intensity of the magnetic field.

5. The apparatus according to claim 4, wherein the second processing subcircuit is configured to determine a locus of handwriting of an electromagnetic pen according to the determined position of the electromagnetic touch, and to determine a width of the handwriting of the electromagnetic pen according to the determined magnetic induction intensity of the magnetic field; and to determine the data signal of the image to be displayed, according to the determined locus and width the handwriting of the electromagnetic pen.

6. The apparatus according to claim 2, wherein the first processing subcircuit is further configured to determine the change quantity of current between the driving current of each of the organic light-emitting diodes, and the obtained detection current thereof according to an absolute value of a difference between the driving current of each of the organic light-emitting diodes, and the obtained detection current thereof.

7. A display device, comprising an apparatus for emitting a magnetic field, an organic light-emitting diode display panel, and the apparatus for detecting an electromagnetic touch according to claim 1.

8. The display device according to claim 7, wherein the apparatus for emitting a magnetic field comprises an electromagnetic pen.

\* \* \* \* \*